(12) United States Patent
McKiernan et al.

(10) Patent No.: US 10,890,621 B2
(45) Date of Patent: Jan. 12, 2021

(54) SYSTEMS AND METHODS FOR TESTING AN EMBEDDED CONTROLLER

(71) Applicant: Raytheon Company, Waltham, MA (US)

(72) Inventors: Terence J. McKiernan, Rancho Palos Verdes, CA (US); Danny D. Nguyen, Irvine, CA (US); Majid J. Yaghoubi, Encino, CA (US); Ann E. Inguanzo, Hawthorne, CA (US); Jeanine T. Duong, Garden Grove, CA (US); John H. Steele, Manhattan Beach, CA (US)

(73) Assignee: Raytheon Company, Waltham, MA (US)

( * ) Notice: Subject to any disclaimer, the term of this patent is extended or adjusted under 35 U.S.C. 154(b) by 276 days.

(21) Appl. No.: 15/607,920

(22) Filed: May 30, 2017

(65) Prior Publication Data
US 2018/0348301 A1    Dec. 6, 2018

(51) Int. Cl.
*G01R 31/3183*    (2006.01)
*G06F 11/22*    (2006.01)

(52) U.S. Cl.
CPC .. *G01R 31/318342* (2013.01); *G06F 11/2268* (2013.01)

(58) Field of Classification Search
CPC ...... G01R 31/318342; G01R 31/31711; G01R 31/318371; G01R 31/31724; G01R 31/318307; G06F 11/2268
See application file for complete search history.

(56) References Cited

U.S. PATENT DOCUMENTS

| 6,185,522 B1 * | 2/2001 | Bakker | G06F 11/261 703/28 |
| 8,135,565 B2 * | 3/2012 | Clune | G06Q 10/04 703/2 |

(Continued)

FOREIGN PATENT DOCUMENTS

EP    1592975 A1 *    11/2005    ..... G01R 31/318307

OTHER PUBLICATIONS

Duelks, Ramona et al., "A real-time test and simulation environment based on standard FPGA hardware," Academic and Industrial Conference, pp. 197-204 (Year: 2009).*

(Continued)

*Primary Examiner* — Rehana Perveen
*Assistant Examiner* — Steven W Crabb
(74) *Attorney, Agent, or Firm* — Daly, Crowley, Mofford & Durkee, LLP

(57) ABSTRACT

Systems and methods described herein provide for testing and debugging different subsystems of an embedded controller using a testing architecture. The testing architecture can simulate messaging interfaces between internal subsystems of the embedded controller and external subsystems the controllers interacts with to integrate various types of software. A method includes generating test support models for one or more subsystems and establishing a communications network between the test support models and a control module of the embedded controller. A clock signal is generated to initiate processing within the testing architecture between the control module and the test support models. An event model is executed at the test support models using the clock signal and data is generated at one or more of the test support models responsive to the event model. The data can correspond to operational parameters of a respective system the embedded controller.

20 Claims, 6 Drawing Sheets

(56) References Cited

U.S. PATENT DOCUMENTS

| | | | | |
|---|---|---|---|---|
| 10,198,333 | B2* | 2/2019 | Trobough | G06F 11/267 |
| 2004/0210798 | A1* | 10/2004 | Higashi | G01R 31/318307 |
| | | | | 714/27 |
| 2005/0165597 | A1* | 7/2005 | Nightingale | G06F 11/3672 |
| | | | | 703/27 |
| 2014/0232422 | A1* | 8/2014 | Sontakke | G01R 31/31917 |
| | | | | 324/750.01 |

OTHER PUBLICATIONS

Sheynin et al.: "D3.1 SpaceWire-RT Simulation and Validation Plan", SpaceWire-RT Consortium 2012; 33 pages.

Olenev et al.: "SpaceWire-RT/SpaceFibre simulation models: implementation and application"; SUAI; Session 9; 18 pages.

Steenari, David: "Real-Time Simulations of SpaceWire On-board Data Handling Networks"; Luleå University of Technology, 2013, 72 pages.

Fourtier, et al.: "Simulation of a SpaceWire Network"; Thales Alenia Space, Etablissement de Cannes; Jul. 2006; pp. 357-365 (9 pages).

\* cited by examiner

SYSTEMS AND METHODS FOR TESTING AN EMBEDDED CONTROLLER

GOVERNMENT INTERESTS

This invention was made with U.S. Government support. The U.S. Government has certain rights in this invention.

BACKGROUND

As is known in the art, control systems having an embedded controller may include software, firmware and/or hardware, and may include communications buses coupled to its host platform and/or external subsystems, devices and sensors. The control system interacts with the platform and/or other subsystems, for example receiving input signals and commands to process and providing output data products and status information. Thus, testing the control system requires the appropriate input and output interfaces to its host platform and these other subsystems. During development of a control system, its components can be designed and constructed in different phases and at different times, thus making it hard to fully test a control system until all components are finished. Further, these control system components and related subsystems can be costly and can have limited availability during development stages of the respective system. The result is that integration and testing of the components is difficult and time-consuming, and that errors found lead to costly rework of already-finished components which further delays delivery of the completed system.

SUMMARY

Systems and methods described herein provide a testing architecture that can be generated to test, analyze and/or debug an embedded controller in a control system, its components and related subsystems. The embedded controller may be included in a wide variety of systems and/or electronic devices, such as but not limited to, space payloads, automobiles, airplanes, ships, telecoms devices, factory equipment, home sensing equipment, etc. The testing architecture can be used to integrate various types of software by simulating messaging interfaces internal to the control system and between the control system and external subsystems. Simulated representations of one or more of the subsystems can be generated and applied to the testing architecture to test and integrate the embedded controller without all of the actual subsystems being present or functional. Thus, the systems and methods described herein can reduce costs and comprehensively test and integrate embedded controller software before the full system is completed.

In an embodiment, the testing architecture can simulate behaviors of the internal and external subsystems to provide realistic operating conditions in time simulated and/or real-time scenarios. Further, a communications network coupling the subsystems of the embedded controller to each other and/or to external subsystems can be simulated and/or interfaces between these subsystems can be simulated. In some embodiments, these simulations can be performed without changing the simulation code and/or embedded code and thus, without changing the testing architecture. For example, each simulation can be driven by one or more data files generated and provided to the embedded controller and/or the simulated subsystems. Thus, the same testing architecture can be used for a variety of different simulations simply by providing different data files unique to a desired testing scenario.

The data files can be used to define simulation behaviors of each of the different subsystems in the system to be tested (e.g., space payload, automobile, etc.) during a respective simulation. For example, one or more data files can be generated for each subsystem being simulated. The data files can include attributes and/or properties of the subsystem, and predetermined and/or expected behaviors of the subsystem for the simulation. Behaviors as used herein may refer to an expected performance of the subsystem under real operating conditions, including correct operations and various errors and failure modes, under (simulated) normal and off-normal conditions. Thus, system designers can determine how the overall system and each of the individual subsystems of the system to be tested may perform under realistic operating conditions and in some embodiments, in real-time.

Each of the testing scenarios and simulations described herein can be executed in a fully automated, scripted mode requiring no operator interaction once the script begins. The testing scenarios and simulations can support a graphical user interface (GUI) for interactive test direction, message generation and status display. In some embodiments, the testing architecture provides extension points to integrate the testing architecture with other platforms and/or operating systems.

In embodiments, the testing architecture is portable so that it can run on a variety of operating platforms including different operating systems, processors and communications interfaces. The simulated subsystems may include abstractions of the corresponding subsystem's hardware and software, formed in abstraction layers with one or more implementations for specific operating platforms. Thus, the simulations can be configurable to interface with an appropriate operating system, processor and communications interfaces on different operating platforms.

In illustrative embodiments, a clock signal of the embedded controller can be controlled and/or simulated to test the system under time simulated and/or real-time operating conditions. The clock signal can be configured to provide distributed simulation start and stop controls to emulate real-time scenarios. For example, a progressive time signal can be generated such that a testing scenario can progress at a predetermined rate, in predetermined intervals and/or start and stop based on an instruction received from a test operator at different points in a testing scenario. Thus, a "real-time clock" of the embedded controller can be controlled using the simulated clock signal to perform simulations in synch with the real-time system under test, such that the respective system being tested does not "know" whether it is running in real-time, faster than real-time or slower than real-time.

In some embodiments, the clock signal can be synchronized with the respective simulation being performed. The simulations can exchange messages between the different subsystems in a time simulated scenario or in real-time based at least in part on a generated clock signal. In some embodiments, the simulations provide diagnostic features such as message logging, message format control, content validation and/or error detection.

In some embodiments, one or more subsystems internal to and/or external to the control system can be replaced by a simulated version to support testing and debugging, referred to herein as test support models. Thus, the testing architecture can use a combination of actual system components and simulated components (i.e., test support models) to perform testing.

In a first aspect, a method for testing an embedded controller comprises generating one or more test support models for one or more subsystems of the embedded controller, establishing a communications network between the one or more test support models and a control module of the embedded controller, generating a clock signal for the control module to initiate processing within the embedded controller and initiate communication between the control module and the one or more test support models, executing an event model at each of the one or more test support models based on the clock signal, generating data at the one or more test support models, the data corresponding to operational parameters of the embedded controller in response to the event model and generating commands by the control module for the one or more test support models in response to the generated data.

The method may further comprise preloading message data, event data, and settings for the one or more test support models based on attributes of the corresponding component. The settings for the one or more test supports models include simulated outputs for the one or more subsystems. The message data, event data, and settings for the one or more test support models can be generated using previous measurements and data captured by the corresponding subsystems during operation of the respective subsystems.

In some embodiments, the method comprises executing one or more discrete time intervals, also known as "frames", of the event model based on the clock signal. The one or more frames can correspond to different time-periods within the event model. The data corresponding to the one or more frames at the one or more test support models can be generated based on the clock signal. The clock signal may include one or more start messages and one or more stop messages to progressively execute the one or more frames of the event model.

The method may comprise generating frame advance messages to instruct the one or more test support models to execute the event model up to a particular frame of the event model and generate data for previous frames of the event model. In some embodiments, the method comprises synchronizing messaging between the control module and the one or more test support models based on the clock signal.

In another aspect, a method for testing subsystems of an embedded controller comprises generating one or more event models for an embedded controller, each of the one or more event models including settings for one or more test support models, and each of the one or more event models having an execution time value. The method further comprises providing the one or more event models to the one or more test support models, executing the one or more event models based on their respective execution time values, generating data by the one or more test support models, the data corresponding to operational parameters of the subsystems of embedded controller during the one or more event models, receiving, at the control module, the generated data from the one or more test support models and generating, by the control module, messages to each of the one or more test support models responsive to the generated data.

In some embodiments, a clock signal can be generated having one or more start messages and one or more stop messages to progressively execute the one or more event models. Each of the one or more event models may include one or more frames corresponding to different time-periods within the one or more event models and data corresponding to the one or more frames at the one or more test support models can be generated based on the clock signal.

The method may further comprise generating frame advance messages to instruct the one or more test support models to execute the one or more event models up to a particular frame of the respective event model and generate data for previous frames of the respective event model.

One or more of the test support models can be polled at different time periods and generating data at the one or more test support models at the different time periods. In some embodiments, the operational parameters may include at least one of sensor data, device data, or a communication network status.

The method may further comprise determining a status of one or more of the subsystems of the embedded controller by comparing the generated data from the one or more test support models to operational thresholds.

In some embodiments, the messages communicated between the control module and the one or more test support models can be logged, for example, in a memory of the embedded controller or a memory communicatively coupled to the embedded controller.

In another aspect, an embedded controller testing system comprises a means for controlling operation of an embedded controller, a means for modeling one or more subsystems of the embedded controller using test support models generated for the one or more subsystems, and a means for testing using one or more event models for the embedded controller. Each of the one or more event models includes settings for the one or more subsystems, and each of the one or more event models having an execution time value. The means for testing executes the one or more event models based on their respective execution time values. The system further comprises a means for communication coupling the means for testing and the test support models such that the test support models can generate data corresponding to operational parameters of the one or more subsystems during the execution of the one or more event models and provide the generated data to the control module.

The subsystems may include at least one of an external command & control module, typically part of the host platform and referred to herein as a "host unit", one or more mechanism controllers, one or more field programmable gate arrays (FPGAs), one or more memory units, one or more sensors, and one or more devices. In some embodiments, the system comprises an abstraction layer platform hosting the one or more test support models and communicatively coupled to the embedded controller.

BRIEF DESCRIPTION OF THE DRAWINGS

The foregoing features may be more fully understood from the following description of the drawings in which.

DETAILED DESCRIPTION

The foregoing concepts and features may be more fully understood from the following description of the drawings.

The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the concepts, systems and techniques described herein. Like numbers in the figures denote like elements.

It should be understood that the embodiments described herein are applicable to a variety of different forms of processing in general in which simulation is desirable. For example, the simulation of systems having an embedded controller, a control interface, external sensors and/or external devices.

Figure 1:
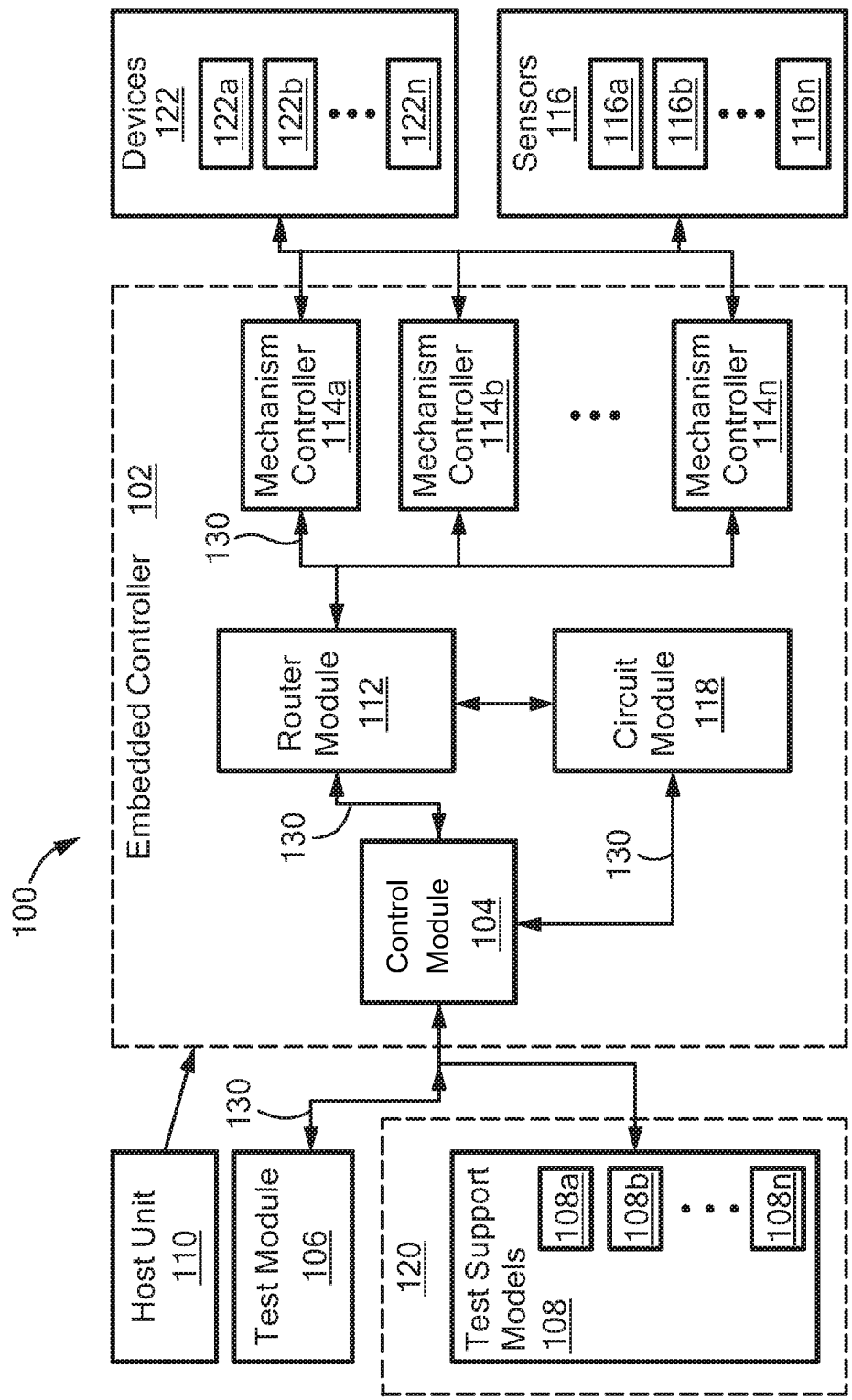
FIG. 1 is a block diagram of a control system in a accordance with illustrative embodiments.

Now referring to FIG. 1, a test system 100 includes an embedded controller 102 having a control module 104 coupled (e.g., directly, communicatively) to a plurality of internal and external subsystems through a communications network 130. External and internal subsystems include a host unit 110, test module 106, one or more test support models 108a-108n, a router module 112, a circuit module 118 and one or more mechanism controllers 114a-114n. Mechanism controllers 114a-114n are coupled to a plurality of sensors 116a-116n and a plurality of devices 122a-122b. Subsystem(s) as used herein may refer to any component, module or unit of test system 100 and/or embedded controller 102. It should be appreciated that test system 100 may include any system having an embedded controller, such as but not limited to, space payloads, automobiles, airplanes, ships, telecoms devices, factory equipment, and home sensing equipment.

Embedded controller 102 can generate and execute various forms of software (e.g., control software) for test system 100. Thus, the embedded controller 102 can control data collection during operation of the test system 100 and communication (e.g., messaging) between the different subsystems of test system 100. In some embodiments, control module 104 of the embedded controller 102 executes the software and/or collects data during different operational scenarios of the test system 100. Control module 104 can include a central processing unit (CPU), a digital signal processor (DSP) or other forms of microcontrollers. In some embodiments, control module 104 may be referred to herein as a means for controlling. For example, the means for controlling operation of the embedded controller 102 may include a CPU, a DSP or other forms of microcontrollers.

To test control module 104 and/or integrate software into control module 104, one or more of the subsystems of embedded controller 102 can be simulated and represented by at least one of test support models 108a-108n. For example, a test support model 108 can be generated for each subsystem. In other embodiments, a test support model 108 can be generated for a portion of the subsystems, based at least in part on a desired simulation. Thus, control module 104 can be tested without physically coupling control module 104 to the respective subsystem(s).

It should be appreciated that the number of subsystems represented by one of test support models 108a-108n can be unique to each simulation, thus the systems and methods described herein can be used to simulate a variety of different operational situations without changing or modifying the testing architecture.

Test support models 108a-108n can be generated for router module 112, circuit module 118, mechanism controllers 114a-114n, sensors 116a-116n and/or devices 122a-122n. The test support models 108a-108n can include simulated versions of router module 112, circuit module 118, mechanism controllers 114-114n, sensors 116a-116n and/or devices 122a-122n. For example, each of test support models 108a-108n can be generated to include attributes of the respective subsystem and be configured to perform and/or behave as the respective component would under similar operating conditions. The conditions can be controlled by data files generated for each simulation and be used to represent a time simulated and/or a realistic operating scenario of the test system 100. Test support models 108a-108n can be used to model the corresponding subsystem. In some embodiments, test support models 108a-108n can be used to model one or more subsystems and thus may be referred to herein as a means for modeling.

The test support models 108a-108n can be generated as abstractions of the corresponding subsystem and be generated in an abstraction layer platform 120. The abstraction layer platform 120 can be coupled to a variety of different operating systems, thus the test support models 108a-108n can be used in a variety of different operating systems. Control module 104 can be coupled to the test support models 108a-108n in the abstraction layer platform 120 through the communications network 130 to provide a testing architecture that is portable and applicable to different operating systems.

Circuit module 118 can include an integrated circuit, such as but not limited to, a field programmable gate array (FPGA). For example, circuit module 118 can be implemented in hardware, software, firmware and/or a combination of the three. Circuit module 118 can include and/or be coupled to one or more memory units within embedded controller 102. For example, circuit module 118 may include or be coupled to a flash memory unit or other forms of memory devices. Circuit module 118 can be coupled to control module 104 to receive data collected during one or more simulations and store the data in the memory units. In some embodiments, control module 104 can retrieve data from circuit module 118.

Mechanism controllers 114a-114n can be coupled to one or more sensors 116a-116n and devices 122a-122n to receive data, transmit data and/or control operation of the respective one or more sensors 116a-116n and/or one or more devices 122a-122n. In some embodiments, each of mechanism controllers 114a-114n can be coupled to one of sensors 116a-116n and/or one of devices 122a-122n. In other embodiments, mechanism controllers 114-114n can be coupled to multiple sensors 116a-116n and/or multiple devices 122a-122n.

Sensors 116a-116n can include a variety of different sensors based at least in part on the particular system being tested. For example, sensors 116a-116n may include telemetry sensors, such as but not limited to, temperature sensors, attitude sensors, position sensors and motion sensors. Devices 122a-122n can include a variety of different devices (or mechanisms, actuators) based at least in part on the particular system being tested. For example, and without limitation, devices 122a-122n may include heaters, coolers, focal plane electronics, focus mechanisms, filters and/or gimbals.

Router module 112 may include a router or other form of networking device for transmitting and receiving information within embedded controller 102 and/or between embedded controller 102 and external subsystems. For example, router module 112 can receive information from one or more mechanism controllers 114a-114n in a variety of different forms and provide the information to control module 104. Router module 112 can be configured to control communication between control module 104 and each of the subsystems internal or external to embedded controller 102.

Host unit 110 can include unit connect or other form of an interface between embedded controller 102 and other components of the test system 100. Host unit 110 can be configured to control router module 112 or otherwise configure communications between embedded controller 102 and different components of test system 100.

Test module 106 can include a test driver and be configured to generate data files for simulations, preload messages, events and/or settings for the subsystems of test system 100. In some embodiments, test module 106 generates start and/or stop simulation messages to begin and/or end a simulation. Test module 106 may include a graphical user interface (GUI). The GUI can be used by a test operator or administrator to generate data files and/or execute a simulation, such as an event model. In some embodiments, test module 106 may include a means for testing (or be referred to herein as a means for testing).

Communications network 130 may include input/output (I/O) interfaces, memory mapping couplings and/or bus connections. In some embodiments, communications network 130 may include multiple buses. For example, communications network 130 may include a first bus (e.g., control bus) for low-volume command & control messages and a second bus (e.g., data bus) for high-volume data from onboard sensors and/or devices. Common control buses may include, but not limited to: SpaceWire, controller area network (CAN), inter-integrated circuit ($I^2C$), military standard (MIL-STD) 1553 and Ethernet. Common data buses may include but not limited to: are Serial RapidIO, Fibre Channel, and Ethernet. In one embodiment, such as a space payload system, communications network 130 may include a spacecraft communication network.

In some embodiments, embedded controller 102 may include a means for communication to couple control module 104 to the plurality of internal and external subsystems. The means for communication may include communications network 130, or various types of input/output (I/O) interfaces, memory mapping couplings and/or a bus connections.

Figure 2:
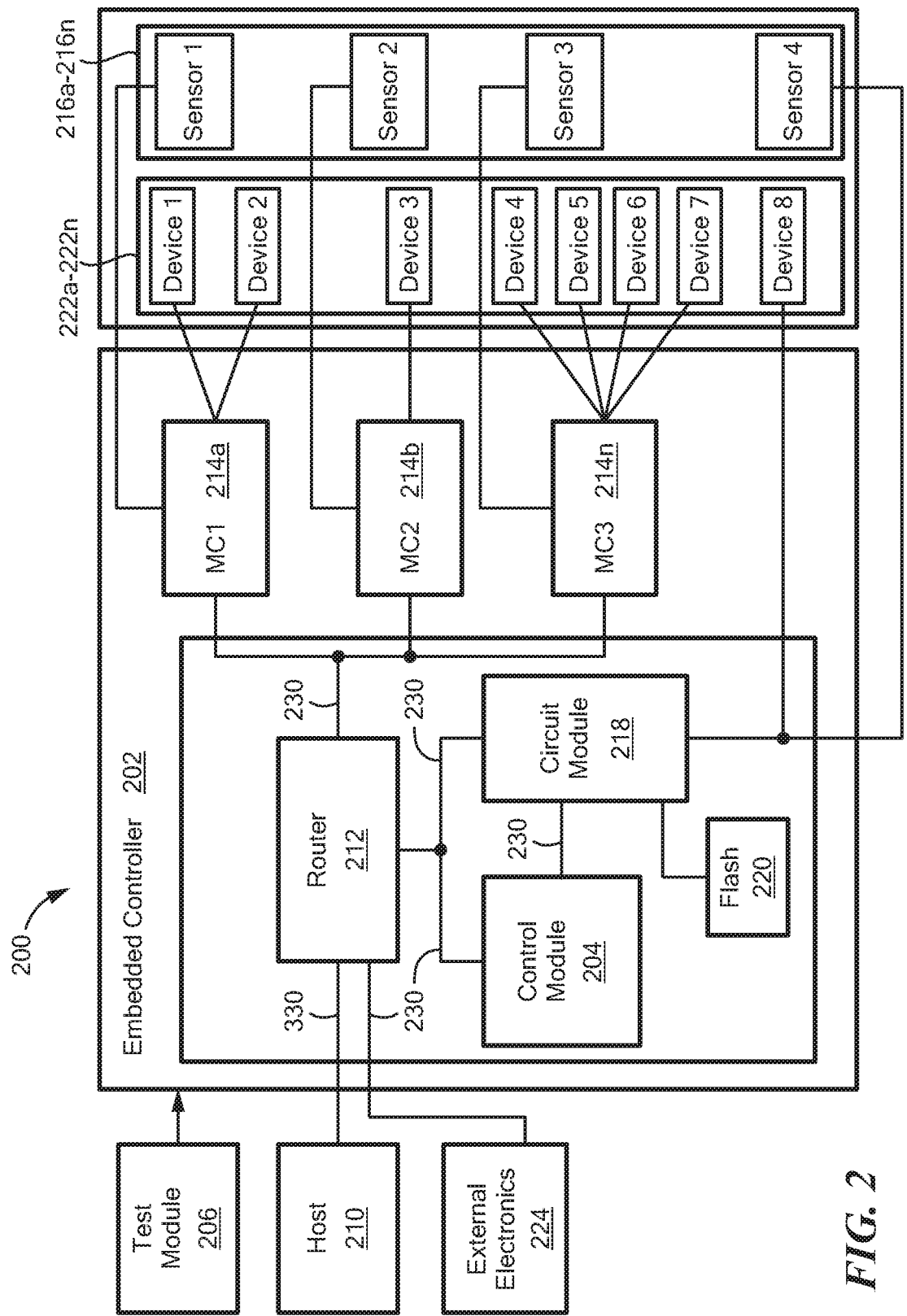
FIG. 2 is a block diagram of a testing architecture for testing the embedded controller of the control system of FIG. 1.

Now referring to FIG. 2, a testing architecture 200 is provided for an embedded controller 202. Embedded controller 202 includes a control module 204 coupled (e.g., directly, communicatively) to a router module 212 and a circuit module 218. Router module 212 is coupled to a test module 206, a host unit 210, external electronics 224, and one or more mechanism controllers 214a-214n (denoted by MC1, MC2 and MC3). Mechanism controllers 214a-214n are coupled to a plurality of sensors 216a-216n and a plurality of devices 222a-222n. Circuit module 218 is coupled to a flash memory 220, the plurality of sensors 216a-216n and the plurality of devices 222a-222. For example, in one embodiment, circuit module 218 can be coupled to a structural heater and a temperature sensor. Each of the components of testing architecture 200 can be coupled through a communications network 230. External electronics 224 is an example of an external subsystem interacting with embedded controller 200 via communications network 230.

It should be appreciated that elements of FIG. 2 having like name designations may be the same as or substantially similar to elements of FIG. 1. For example, test system 100, embedded controller 102, control module 104, host unit 110, test module 106, router module 112, circuit module 118, mechanism controllers 114a-114n, sensors 116a-116n, and devices 122a-122n (and their corresponding test support models) of FIG. 1, may be the same as or substantially similar to testing architecture 200, embedded controller 202, control module 204, host unit 210, test module 206, router module 212, circuit module 218, mechanism controllers 214a-214n, sensors 216a-216, and devices 222a-222n (and their corresponding test support models), respectively.

In an embodiment, testing architecture 200 can be used to test, analyze and debug control module 204. For example, one or more of router module 212, circuit module 218, test module 206, host unit 210, external electronics 224, mechanism controllers 214a-214n, sensors 216a-216n and/or devices 222a-222n can be represented by a test support model (e.g., test support models 108a-108n of FIG. 1). The test support models can be simulated versions of each of the above discussed subsystems of embedded controller 202. Testing architecture 200 can be used to simulate messaging through communications network 230 between each of the subsystems and/or between the subsystems and control module 204. The test support models can simulate behaviors of the subsystems within testing architecture based on one or more data files provided from test module 206. Thus, the general design and framework of testing architecture 200 can remain the same or substantially the same for a variety of different simulations, by simply modifying one or more data files provided to test module 206 and then provided to embedded controller 202.

In some embodiments, the communications network 230 can be simulated between control module 204 and one or more subsystems of an embedded controller 202 in a variety of different simulations without modifying the testing architecture 200. For example, without changing simulation code or embedded code used to create testing architecture 200. In one embodiment, simulations can be generated using the same or similar universal modeling language (UML) models as a software executing on the control module of the respective system, thus increasing compatibility and reducing or eliminating the need to generate additional code for the simulations.

Figure 3:
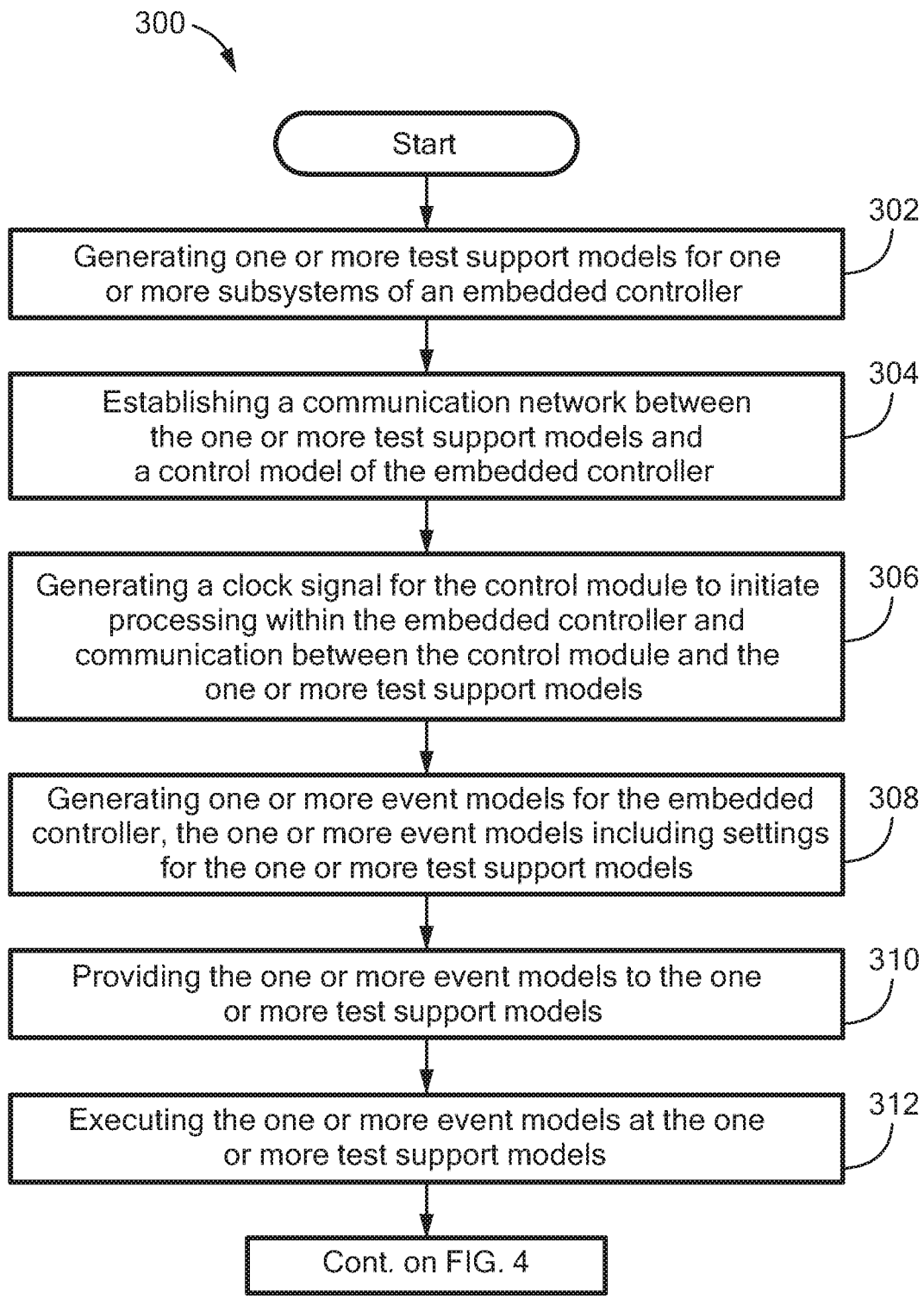
FIGS. 3-4 are a flow diagram of a method for testing the embedded controller of the control system of FIG. 1.
Figure 4:
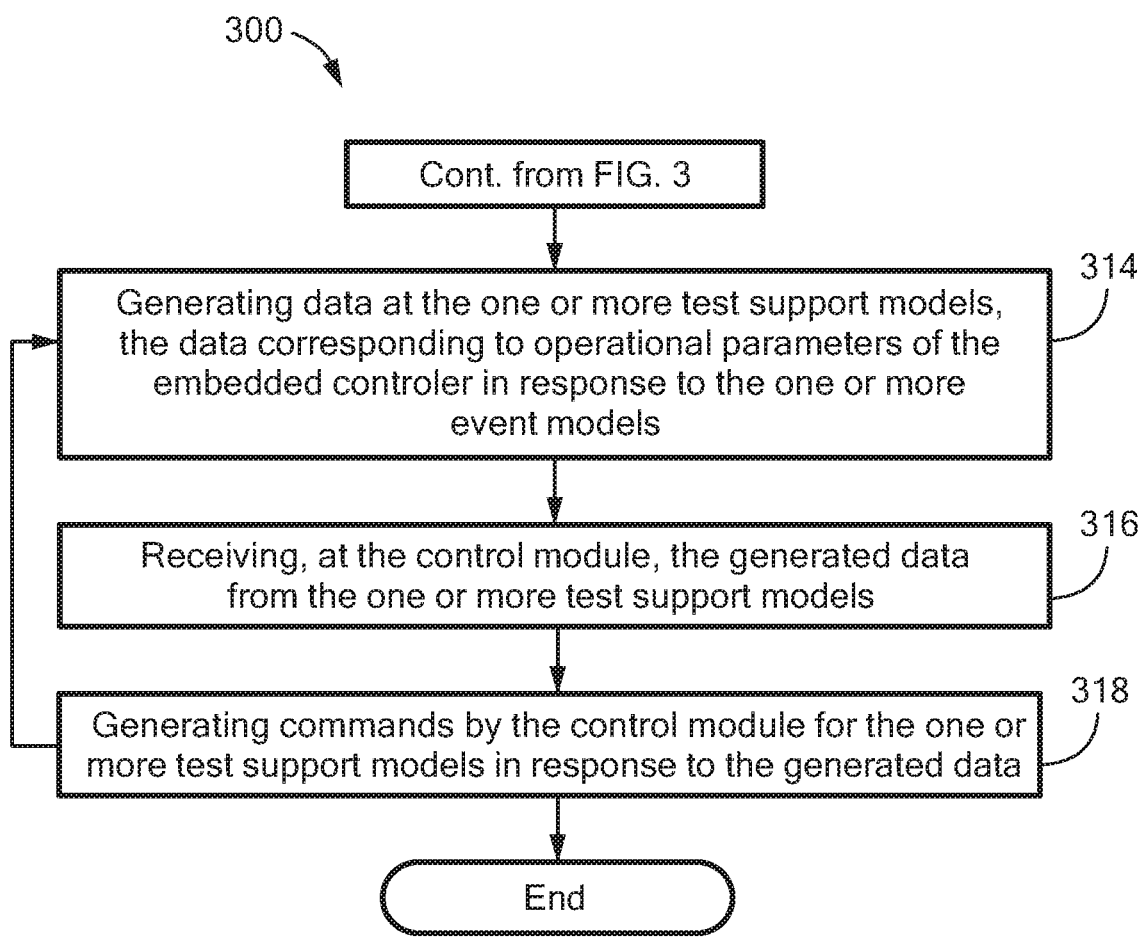

Now referring to FIGS. 3-4, a method 300 for testing an embedded controller 202 (shown in FIG. 2) of a test system begins at block 302, by generating one or more test support models for one or more subsystems of the embedded controller 202. In an embodiment, each of the test support models can correspond to a subsystem (e.g., component) external to and/or internal to embedded controller 202. For example, and as shown in FIG. 2, the subsystems may include a host 210, a test module 206, a router module 212, a circuit module 218, one or more mechanism controllers 214a-214n, one or more sensors 216a-216n and one or more devices 222a-222n.

The test support models can be configured to mimic the behaviors of the corresponding subsystem during a test event (operational simulation). For example, the test support models can be generated to include the attributes and properties of the corresponding subsystems such that each of the test support models responds to a test event in the same or substantially similar manner that the corresponding subsystem would in a real operational scenario. In one embodiment, a test support model generated for a temperature sensor can be configured to generate simulated temperature data that matches the temperature data the temperature sensor would measure and collect under the same or substantially similar conditions. In an embodiment, the test events can correspond to real-time operational scenarios. It should be appreciated that these scenarios may include normal operating conditions and expected measurements and/or behaviors, and/or also abnormal conditions, error conditions, noisy or corrupt data and other failures. In this way, the test support models help assess the behavior and performance of the embedded controller, including error detection, fault mitigation and status reporting under the wide range of conditions it may encounter in the real world.

The behavior of the test support models may be configured using expected and/or desired results. For example, the simulated outputs (and thus the responses) of the test support models may be generated using previously measured data from the different subsystems during operation of the respective test system. In some embodiments, the data can be entered by an operator through a GUI of the test module 206.

At block 304, communication network can be established between the one or more test support models and a control module of the embedded controller.

In some embodiments, and as shown in FIG. 2, a communications network 230 can be established between each of the subsystems of the embedded controller 202 and the test support models generated for each of the subsystems. The test support models will be described herein using the reference designations for the corresponding subsystem. For example, the router module 212 can establish the communication network 230 between the host unit 210, the mechanism controllers 214a-214n, the circuit module 218 and the control module 204. In the communication network 230, each of the subsystems can communicate with each other and/or with the control module 204. In some embodiments, the control module 204 can be coupled to one or more test support models (e.g., host unit 210, external electronics 224, test module 206, router module 212, circuit module 218, flash 220, mechanism controllers 214a-214n, sensors 216a-216n, devices 222a-222n) representing the subsystems through the communications network 230.

In some embodiments, the test support models can be generated in an abstraction layer platform that separates them from the underlying computing system, operating system or platform. The abstraction layer platform can be coupled to a variety of different computing systems, operating systems or platforms, and thus the test support models can be used on a variety of different computing systems, operating systems or platforms. The control module 204 can be coupled to the test support models in the abstraction layer platform to create a testing architecture 200 that is portable.

Using the communications network 230, the host unit test support model 210 can initialize and power on each of the subsystems of the embedded controller 202 and/or the corresponding test support models. In some embodiments, the host unit test support model 210 can be configured to modify a state and/or mode of each of the subsystems of the embedded controller 202 to perform testing. For example, each of the subsystems may have an off state, a safe state and an on state.

In the off state, the embedded controller 202 and subsystems are not operational and not powered up yet or initialized. Initialized as used herein may refer to having data and/or settings applied to the respective subsystem. In the safe state, the embedded controller 202 can be partially operational and in communication with the host unit test support model 210. To be partially operational, a portion, but not all, of the subsystems of the embedded controller 202 can be operational and initialized. In the on state, each component in the embedded controller is powered on and initialized.

In some embodiments, to establish a test environment (e.g., testing architecture), only a portion of the subsystems of the embedded controller 202 may be operational and initialized and the remaining subsystems can be modeled using corresponding test support models. Thus, the operational subsystems can be tested using the test support models.

The host unit test support model 210 can receive power and selectively initialize and power on one or more of the subsystems. For example, based on a respective test environment, the host unit test support model 210 can selectively initialize and power up different subsystems, while the remaining subsystems are modeled using test support models. In some embodiments, the host unit test support model 210 can selectively initialize and power up different subsystem test support models to establish a test environment.

In a first test environment, control module 204 may be initialized and powered on and communicatively coupled to the host unit test support model 210, and each of the remaining subsystems of the embedded controller 202 can be modeled using test support models.

In a second test environment, the control module 204 and one or more mechanism controllers 214a-214n coupled to the embedded controller 202 can be initialized and powered on to communicate the host unit test support model 210 and the control module 204. The remaining subsystems can be modeled using test support models.

For example, in one embodiment, one or more of sensors 216a-216n can be enabled and a mechanism controller 214 coupled to each of them can be modeled using a test support model. The modeled sensors 216a-216n (e.g., temperature sensors, position sensors, attitude sensors, motion sensors) can be configured to maintain each of the subsystems within a valid operating range during the test and communicate a status of each of the subsystems during the test to the control module 204 through the mechanism controller test support model. For example, if one of the sensors 216a-216n was a temperature sensor, then the corresponding test support model would generate and report temperature data during the test. It should be understood that a variety of different test environments can be established using different combinations of the subsystems and subsystem test support models.

At block 306, a clock signal can be generated for control module 204 to initiate processing within embedded controller 202, for example, to initiate communications between the control module 204 and one or more subsystem test support models. In some embodiments, a clock signal can be generated to simulate real-time scenarios using the embedded controller 202. The timing between each of the subsystems of the embedded controller 202 and the subsystem test support models can be synchronized using the clock signal. In some embodiments, the subsystems of the embedded controller 202 may include hardware components and the subsystem test support models may include software components.

To simulate a real-time scenario, the clock signal can be generated to include one or more interrupts. The interrupts can be generated at a variety of different frequencies based at least in part on the subsystem generating the interrupt and/or the component receiving the interrupt. For example, in one embodiment, the host unit test support model 210 can generate messages (e.g., time of day messages) at a first frequency and transmit the first frequency message to the router test support model 212. The router test support model 212 can generate an interrupt at the first frequency to signal a pin on the circuit module test support model 218. The circuit module test support model 218 can generate an interrupt at a second frequency aligned with the first frequency message from the host unit test support model 210 and transmit the second frequency interrupt to the control module 204 and/or the mechanism controller test support models 214a-214n.

In some embodiments, the circuit module test support model 218 may not receive the first frequency interrupt from the router test support model 212 because the circuit module test support model 218 may not interface directly with the router test support model 212. Thus, a clock signal may be generated to simulate receiving the first frequency interrupt at the circuit module test support model 218. The circuit module test support model 218 can signal at a second frequency a software interrupt service routine (ISR) of the software executing on control module 204 to initiate processing at the control module 204. In some embodiments, responsive to receiving the second frequency interrupt, the control module 204 can initiate transmitting write to and read from messages to mechanism controller test support models 214a-214n to control the corresponding mechanisms and/or to collect operational data.

The clock signal may be generated using a local clock system of the embedded controller or a local clock system of a computing device or processor the test environment is executing on. Alternatively, the clock signal may be entirely simulated by one of the test support models, such as circuit module test support model 218 in the embodiment previously mentioned, and not directly tied to any local clock signal in the test environment.

The mechanism controller test support models 214a-214n can base their timing on receipt of messages from control module 204, host test support model 210 or other test module 206, tied to the clock signal. For example, in one embodiment, the host test support model 210 can transmit messages via communications bus 230 to each of the mechanism controller test support models 214a-214n during each time simulated cycle (frame). Responsive to receiving the messages, the mechanism controller test support models 214a-214n may assume or be instructed that time has moved forward by duration of the frame. The mechanism controller test support models 214a-214n can execute event models for the frame duration and instruct the sensor test support models to capture data corresponding the event model for that frame.

At block 308, one or more event models can be generated for the embedded controller and for the test system. The event models may include settings for one or more of the test support models. In some embodiments, each event model may include an execution time value.

Each event model may include a testing scenario for the embedded controller 202. The testing scenarios can be used to test the embedded controller 202 and/or individual subsystems of the embedded controller 202 under time simulated and/or realistic operating conditions. In different testing scenarios, test support models can be generated for one or more of the subsystems and/or for subsystems coupled (e.g., communicatively, directly) to the embedded controller. In an embodiment, the test support models can include a simulated version of the respective subsystem. For example, in one embodiment, the control module 204 of the embedded controller 202 can be coupled to a plurality of test support models generated for the remaining subsystems (e.g., host unit 210, external electronics 224, test module 206, router module 212, circuit module 218, flash 220, mechanism controllers 214a-214n, sensors 216a-216n, devices 222a-222n). Thus, in such an embodiment, the performance of the control module 204 and the interactions of the control module 204 with the remaining subsystems can be tested using the test support models. It should be appreciated that, in some embodiments, a test support model can be generated for control module 204 itself, and thus the performance of other subsystems of embedded controller 302 can be tested using the control module test support model.

In an embodiment, the test event may define which subsystem or subsystems are to be tested during a given test event. During the test, the subsystem(s) being tested can be the actual hardware, firmware or software components of embedded controller 202, while the remaining subsystems can be represented by test support models. Thus, a given test event can contain any combination of actual subsystems and test support models for simulated subsystems.

Each event model may simulate the operation of the embedded controller 202 in a specific environment and/or performing a variety of different functions. Thus, each event model can include data and information corresponding to that environment or the different functions.

One or more data files can be generated by the test module 206 or provided to the test module 206 to initialize the test support models with attributes of the respective subsystems they are to represent. For example, attributes of the different subsystems may be preloaded into a test support model based at least in part on the testing scenario. During each test event, each subsystem of the embedded controller 202 may be expected to respond in a predetermined way and/or generate measurements and data in an expected way to simulate a realistic operation of the embedded controller 202.

The data files may include measurements and data for the respective subsystem based at least in part on the testing scenario. Thus, the data files may include expected data and/or results of the respective subsystem, previously collected data from the respective subsystem, or data generated by a test operator or other user of the respective subsystem. These data files may include normal operating conditions and measurements or behaviors, and also abnormal conditions, error conditions, noisy or corrupt data and other failures. In an embodiment, using the expected results for the subsystems represented by the test support models, any issues with the real subsystems can be isolated and identified in the embedded controller 202 during execution of the event model.

The data files can be preloaded into one or more of the test support models. In an embodiment, one or more different data files can be provided to each test support model. The test support models can read the data files, determine what information is provided in them and initialize the event model. The data files may include control event information, timer event information, and/or preformatted messages. Control events may contain settings and instructions for the test support models to modify their state and/or behavior. In an embodiment, control events can contain commands to start, stop or restart processing, enter a specific processing mode, enable or disable debugging, enable or disable logging of diagnostic data, and/or enable or disable simulation of failures or error conditions. Timer events may contain information about the test event clock and advancement of time. Preformatted messages may contain data, conformant with the interface design of embedded controller 202, to be sent via communications bus 230 to the control module 204 and/or any of the test support models during the test.

The preformatted messages may contain such data as would normally be exchanged over communications bus 230 during the operation of embedded controller 202, for example and without limitations, commands and responses. The preformatted messages may also contain control event information and/or timer event information, as described in the previous paragraph, to be distributed by one or more test support models to other test support models during the test. Upon receipt of a control event or timer event message during a test, a test support model can process that event in the same way as it would have had the event been read from that test support model's own data file. Thus, test control and timer event information may be provided to the test support models by way of data files and/or messages. In an embodiment, the host unit test support model 210 can read in control event and timer event messages to send to the other test support models during the test, in order to control and/or synchronize their operation.

In an embodiment, in response to control event information, the host unit test support model 210 can set a state of the test support models for one or more subsystems. For example, the host unit test support model 210 can command a subsystem to start or stop operation, enter a debug mode, log diagnostic data, enter an error state or otherwise modify its behavior.

In an embodiment, in response to timer event information, the host unit test support model 210 can generate a clock signal for the event model. The clock signal can include one or more interrupts to simulate a real-time clock signal. In some embodiments, the clock signal can instruct modeled subsystems to execute the event model or to execute one or more frames of the event model. A frame may include a time period within the event model. Thus, an event model may include multiple frames. For example, in one embodiment, the clock signal can instruct one or more subsystems to advance to a frame at a predetermined point in the event model.

In response to a preformatted message, a test support model can add the message to an event queue for the test event. The message can be conformant to the design of embedded controller 202 and represent any command, response or other message that would occur during the operation of embedded controller 202. Each message can include a sender subsystem, a recipient subsystem, and an execution time value. During the execution of the test event, when the event model time advances to the execution time of each message, the sender test support model can send the message to the recipient. In an embodiment, the host unit test support model may read in from its data file a series of command messages to send to subsystems of embedded controller 202 during the test, and thus stimulate the subsystems under test by sending these command messages at the designated execution times.

The test module 206 can set the attributes for the event model based at least in part on the information provided in the data files. Thus, in an embodiment, the test events as described herein can be driven by the data files and not hardcoded. For example, the various subsystems of embedded controller 202 and/or the communications network 230 between these subsystems and control module 204 can be simulated with varying behaviors without changing the simulation code, embedded code or testing architecture. In some embodiments, when all of the data files have been analyzed, the host unit test support model 210 can initiate the event model.

At block 310, the event models may be provided to the test support models. The test support models can be communicatively coupled to a control module 204 through a communications network 230. In some embodiments, the event models are preloaded from data files into the subsystem test support models before initiation of the test events. In some embodiments, the event models may be distributed via messages from one test support model to other test support models, for example, from the host unit test support model 210 to the mechanism controller test support models 214a-214n.

At block 312, one or more event models corresponding to a test event can be executed at one or more subsystem test support models. The conditions of the test event can be driven by one or more of the data files preloaded into the subsystem test support models. In some embodiments, the event models can be executed based on the clock signal, their respective execution time value or a combination of both. One or more of the event models can be assigned different execution time values. In some embodiments, each of the event models may be assigned the same execution time value. The execution time values can correspond to different frames within the test event.

In an embodiment, as each of the subsystems can be represented by a test support model during the test event, including control module 204, the test event can be used to provide expected results from each of the subsystem test support models such that any errors or issues can be isolated to the control module 204 or a simulated version of control module 204 (e.g., control module test support model). Thus, the test event can be used to test and debug the control module 204 and various forms of software executing on the control module 204.

To initiate the test event, the test module 206 can transmit a start message to one or more of the host unit test support model 210, the circuit module test support model 218 and/or the mechanism test support models 214a-214n to instruct them to begin executing and communicating with one or more subsystems and/or subsystem test support models of the embedded controller 202. In some embodiments, responsive to transmitting the start message to the host unit test support model 210, data corresponding to one or more frames of the test event can be uploaded to the host unit test support models 210. The frames may correspond to different time periods within a single test event.

In some embodiments, the host unit test support model 210 can transmit a frame advance message to the circuit module test support model 218 to instruct the circuit module test support model 218 to execute the test event up to a particular frame in the test event and capture sensor data for previous frames in the test event.

The host unit test support model 210 can transmit various messages to the control module 204 to instruct the control module 204 to read or write its local data, send commands to the other subsystems (or their corresponding test support models) and/or request data from different subsystems (or their corresponding test support models). In some embodiments, the host unit test support model 210 can transmit multiple messages per frame or per test event. For example, the host unit test support model 210 can transmit messages to control mechanisms or devices (e.g. gimbals or actuators) and/or to read data from sensors (such as temperature data). In another example, the host unit test support model 210 may transmit messages to write operational parameters to the memory of control module 204, router 212 and/or circuit module 218, and/or to read telemetry data from the memories of these same subsystems.

In some embodiments, responsive to receiving the start message and/or frame advance messages from the host unit test support model 210, the circuit module test support model 218 can transmit an execute message to mechanism controller test support models 214a-214n. The execute message can instruct the mechanism controller test support models 214a-214n to begin executing the test event and/or different frames within the test event. Each of the mechanism controller test support models 214a-214n can be coupled to one or more sensor test support models 216a-216n and one or more device test support models 222s-222n. Thus, the mechanism controller test support models 214a-214n can transmit execute messages to the sensor test support models 216a-216n and device test support models 222s-222n to instruct them to begin executing the test event and/or different frames within the test event. In this way, the simulated time within the test event is synchronized across the test support models.

At block 314, data can be generated at one or more of the test support models. The data can correspond to operational parameters of the embedded controller 204 in response to the one or more event models. In an embodiment, a telemetry process can be initiated between the circuit module test support model 218 and/or the mechanism controller test support models 214a-214n, and the coupled sensor test support models 216a-216n and/or device test support models 222a-222n to generate data that represents a simulated version of taking measurements and collecting data. The telemetry process may include one or more of the sensor test support models 216a-216n and/or device test support models 222a-222n generating data for the test event and sending it to the coupled circuit module test support model 218 and/or mechanism controller test support models 214a-214n.

To initiate per-frame processing including the generation and capture of data, the circuit module test support model 218 can transmit a second frequency signal (or interrupt) to the control module 204. For example, the circuit module test support model 218 can receive a first frequency signal from the host unit test support model 210. The circuit module test support model 218 can generate an interrupt at the second frequency aligned with the first frequency message from the host unit test support model 210 and transmit the second frequency interrupt to the control module 204 and/or to one or more mechanism controller test support models 214a-214n. In some embodiments, the second frequency interrupt signals to the control module 204 to begin requesting measurements and data for the per-frame telemetry process.

The data can correspond to operational parameters of the respective system being tested based on the parameters of the test event. The data can be collected for an entire test event and/or individual time frames within the test event. One or more of test support models 210, 218, 212a-212n, 216a-216n, and/or 222a-222n may generate data for the frame. The control module 204 may request data from host unit test support model 210, router test support model 212, circuit module test support model 218 and/or mechanism controller test support models 216a-216n. Circuit module test support model 218 and/or mechanism support models 212a-212n may in turn request data from coupled device test support models 216a-216n and/or from coupled device test support models 222a-222n. Sensor test support models 216a-216n may include but are not limited to temperature sensors, attitude sensors, position sensors, and other forms of environment sensors. Device test support models 222a-222n may include but are not limited to filters, focus mechanisms, gimbals, and actuators. Thus, the data generated/captured may include temperature, attitude, position, filter status, focus mechanism status, gimbal status, actuator status or other telemetry for one or more subsystems.

At block 316, the control module 204 can receive the generated data from one or more of the sensor test support models 216a-216n and/or device test support models 222a-222n. The sensor test support models 216a-216n can transmit the captured data to mechanism controller test support models 214a-214n and the mechanism controller test support models 214a-214n can transmit the generated data to the circuit module test support model 218. In some embodiments, the circuit module test support model 218 can transmit the generated data to the control module 204. In other embodiments, the circuit module test support model 218 can generate and transmit a second frequency signal (or interrupt) to the control module 204 to indicate to the control module 204 that the generated data is being stored in a memory unit of the circuit module test support model 218.

At block 318, in response to the generated and/or captured data or other conditions in the test event, the control module 204 may generate messages to one or more of the subsystem test support models including host unit test support model 210, router test support module 212, circuit module test support model 218 and/or mechanism tests support models 214a-214n. These messages may include commands to read from or write to memory on these test support models, or to modify a state or property related to the state of the test event. The commands can be the same for one or more test support models or unique to each test support model sent to.

In an embodiment, control module 204 may send a message to instruct circuit module test support model 218 and/or a mechanism controller test support model 214a-214n to control or configure a coupled sensor test support model 216a-216n or device test support model 222a-222n. For example, the control module 204 can generate a gimbal command message to a mechanism controller attached to gimbal device to change an angle or otherwise modify its position. This message would be processed by the corresponding mechanism controller test support model 214, which would in turn generate commands to configure the associated gimbal device test support model 222 and read the gimbal position data from the associated sensor support model 216.

In some embodiments, the control module 204 may send messages to the test support models based on its own internal logic or test event conditions, not solely in response to a clock signal, generated or captured data, or a message from the host unit test support model 210. For example, the control module 204 may command the mechanism controller test support models 214 to a known safe state during system startup, or in response to detecting a fault during data processing. As another example, the control module 204 may request telemetry data from the circuit module test support model 218 during each frame, whether or not the host unit test support model 210 has requested telemetry for that subsystem.

In some embodiments, the control module 204 can transmit data generated or collected during a test event to the host unit test support model 210. The host unit test support model 210 can update an event database with the test event data. In some embodiments, the host unit test support model 210 can update a status of one or more subsystems (or their respective test support models) of the embedded controller 202 in response to the received test event data.

In an embodiment, the test module 206 can perform a post-test event analysis. During the test event, all test event data including communications (e.g., messages) between the different subsystems (including but not limited to control module 204) and/or subsystem test support models can be logged and recorded. The post-test event analysis may include analyzing the event models executed during the test event and communications between each of the subsystems, subsystem test support models and the control module 204 during the test event. For example, in an embodiment, a test event may involve commands from control module 204 to configure mechanism controller test support model 214a. These communications would be logged and analyzed by test support module 206 after the test.

The test module 206 can determine that the appropriate communication occurred during the test event. In some embodiments, the test module 206 can identify connection issues within the embedded controller 202 by identifying missing communications between different subsystems of the embedded controller 202. The test module 206 may compare the logged messages to a predetermine list of messages for the test event to determine if the appropriate communications occurred during the test event. The predetermined log may include a listing of required communications for the test event. Thus, the test module 206 can identify connection issues and/or non-responsive test support models during the post-test event analysis.

In some embodiments, the test module 206 may determine a status of the embedded controller 202 or subsystems by comparing the captured data from the one or more test support models to operational thresholds. Operational thresholds may include the expected results for the event model based at least in part on the preloaded data files.

In some embodiments, a test operator or analyst can use test module 206 to perform a post-test event analysis, using a graphical user interface (GUI), text-mode interface or other interface provided by test module 206 to execute the analysis and review the results.

The host unit test support model 210 can generate a second clock signal to instruct the control module 204 and the circuit module test support model 218 to advance to a second or different frame for a second testing scenario (e.g., different from the frame or frames of the first testing scenario). Thus, the method 300 may return to block 314 to begin generating and/or capturing data at one or more test support models for the second testing scenario. In some embodiments, method 300 may be a loop that continues a predetermined number of event models have been executed or until a user stops method 300 through a GUI of the test module 206.

Figure 5:
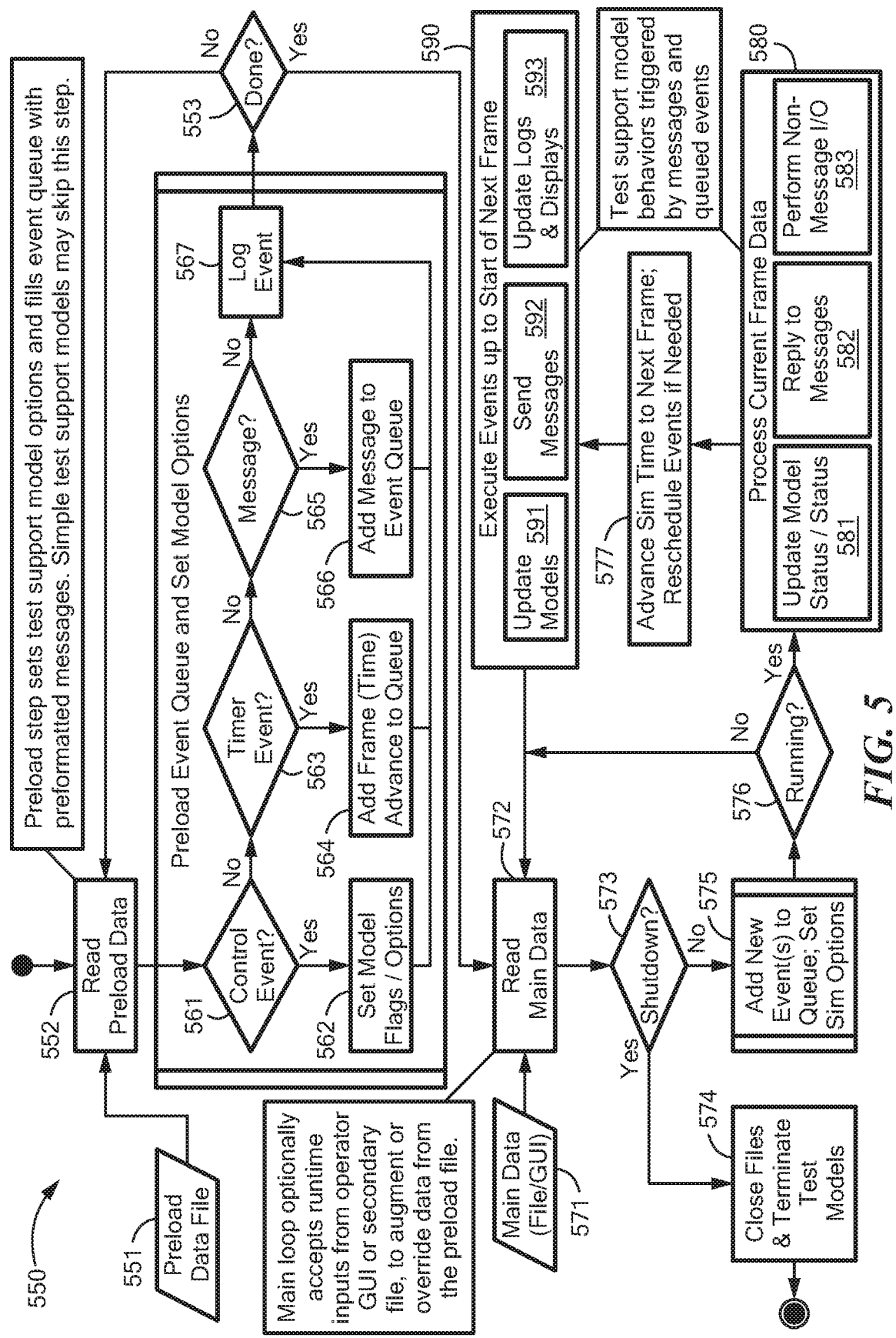
FIG. 5 is a flow chart of a method for executing a simulation for subsystems internal and/or external to the control system of FIG. 1.

Referring now to FIG. 5, a method 550 for a test support model (such as the host unit test support model 210 in FIG. 3) to execute an event model as part of a simulated scenario is illustrated. There are two phases of execution: first, represented by blocks 551-567, preloading scenario events and controls from data files 551 into a time-ordered event queue, prior to the start of the scenario, and second, represented by blocks 571-593, executing the scenario via behaviors triggered by these time-ordered events, optional additional runtime inputs at block 571, and/or interactions with embedded controller, its subsystems, and/or other test support models at runtime. Each test support model that is part of a given scenario may follow this same or substantially similar overall process, with the same or different sets of data files 551 and runtime inputs 571, to implement its specific behaviors required for the scenario.

Preloading events for event model begins at block 552. A test support model reads data items from one or more data files 551. These data items may include one or more simulation control events, simulation timer events, simulation data to load into the test support model's memory, and/or messages for the test support model to send out at specific times during the simulation.

In block 560, each event model data item read from data files 551 is either processed immediately or added to a time-ordered event queue to be executed during the simulation. At block 561, if the data item is a control event, then at block 562, the associated flags or options of the test support model are set. At block 563, if the data item is a timer event (i.e. to set or advance the simulation scenario time), then at block 564 that timer event is added to the time-ordered event queue. At block 565, if the data item is a message for the test support model to send out during the simulation, then at block 566, that message is added to the time-ordered event queue. At block 567, each preloaded data item is logged for purposes of diagnostics and post-run analysis. At block 553, if there are more data items to read in then the block 560, process is performed for the next data item. If not, the test support model begins executing the simulation at block 572.

The simulated scenario is executed as shown in blocks 571-593. The overall execution process is a loop during which each test support model checks for additional runtime inputs, updates its event queue accordingly, processes events and data for the current frame, moves the simulation time forward, and then executes any additional events up to the start of the next frame. The loop is repeated until the test support models are shut down via a preloaded control event, a runtime control event, or runtime operator action.

Specifically, at block 572, each test support model checks for additional runtime inputs 571. These inputs, if any, may augment or override the controls and events preloaded from data files 551. They may be provided as data files in the same form as the preload data files 551, or from an operator via a GUI, or via network communications or any other means. At block 573, if an additional runtime input is a shutdown signal (i.e. a control event stopping the simulation), or if the next item in the time-ordered event queue is a shutdown signal, then at block 574 the test support model closes all data files and terminates processing. Otherwise, the runtime inputs 571, if any, received at block 572, are added to the time-ordered event queue at block 575. This is the same time-ordered event queue used to hold the preloaded data items from data files 571, as previously described.

At block 576, if the simulated scenario is running (i.e. control events have been loaded instructing the test support model to advance simulation time and process its event queue), then event processing begins at block 580. Otherwise, control returns to block 572, to check for additional runtime inputs. This allows the test operator or other external system to temporarily pause the simulation, assess its state, and/or provide other inputs to modify the state of the simulation as desired before allowing it to proceed.

At block 580, each test support model executes time-ordered events for the current frame. This may include updating the test support model's internal memory, state and/or status in block 581, replying to messages received from other test support models, the embedded controller and/or its subsystems in block 582, and/or performing other non-message-based input/output (I/O) such as reading other data files or discrete inputs in block 583. Once all time-ordered events for the current frame are processed, then at block 577, the test support model advances simulation time to the next frame. Next, in block 590, the test support model performs any actions required to update the simulated scenario to match the new simulation time i.e. the start of the next frame. This may include updating the test support model's state in block 591, sending messages to other test support models, the embedded controller and/or its subsystems in block 592, and/or updating data logs or displays in step 593. Once all updates have been completed to advance the state of the simulated scenario to the start of the next frame, processing continues at block 572 as previously described.

Figure 6:
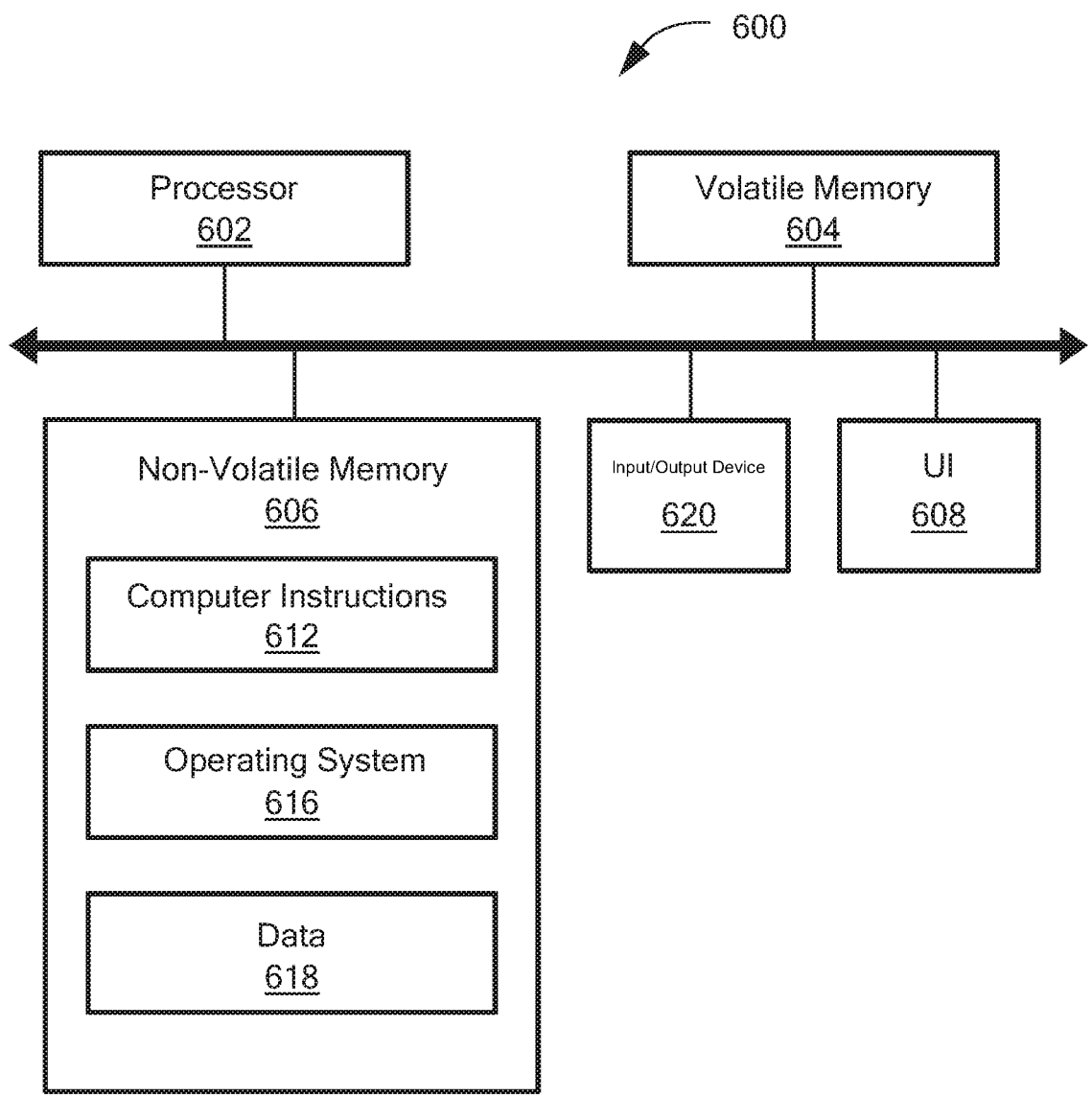
FIG. 6 is a block diagram of an embodiment of a processing system for testing a control system with the techniques described herein.

Referring now to FIG. 6, a computer 600 includes a processor 602, a volatile memory 604, a non-volatile memory 606 (e.g., one or more hard disks, solid state disks, flash memories etc.), a user interface (UI) 608 (one or more text mode or graphical displays) and one or more input/output devices 620 (e.g. mouse, keyboard, printer, network interface). The non-volatile memory 606 stores computer instructions 612, an operating system 616 and data 618.

In some embodiments, the data 618 may include one or more files or look-up tables used by the test support models during a test, and/or collected during a test of an embedded control system. The data 618 used by the test support models may include but is not limited to scenarios, parameters, frame durations and sequencing, messages, and operational data to be sent and/or received by the test support models and/or control module during the test. The data 618 collected during a test may include but is not limited to temperature data, attitude data, health/status data and other telemetry. In one example, the computer instructions 612 are executed by the processor 602 out of volatile memory 604 to perform all or part of the method (or process) 300 of FIGS. 3-4, and/or method (or process) 550 of FIG. 5.

In an embodiment, computer 600 may be the same as or substantially similar to each of the components of test system 100 of FIG. 1, such as embedded controller 102, control module 104, host unit 110, test module 106, one or more test support models 108a-108n, router module 112, circuit module 118, mechanism controllers 114a-114n, sensors 116a-116n, and devices 122a-122n (and their corresponding test support models) and testing architecture 200 of FIG. 2, such as embedded controller 202, control module 204, router module 212, circuit module 218, test module 206, host unit 210, external electronics 224, mechanism controllers 214a-214n, sensors 216a-216, devices 222a-222n, and flash memory 220 (and their corresponding test support models). Computer 600 may perform all of the same functions and be configured to receive and generate the same data as each of test system 100 of FIG. 1, embedded controller 102, control module 104, host unit 110, test module 106, one or more test support models 108a-108n, router module 112, circuit module 118, mechanism controllers 114a-114n, sensors 116a-116n, and devices 122a-122n (and their corresponding test support models), testing architecture 200 of FIG. 2, embedded controller 202, control module 204, router module 212, circuit module 218, test module 206, host unit 210, external electronics 224, mechanism controllers 214a-214n, sensors 216a-216, devices 222a-222n, and flash memory 220 (and their corresponding test support models). For example, computer 600 may be configured to simulate a realistic operation of an embedded controller using a control module and one or more test support models.

Methods 300 and 550 are not limited to use with the hardware and software of FIG. 6; they may find applicability in any computing or processing environment and with any type of machine or set of machines that is capable of running a computer program. Methods 300 and 550 may be implemented in hardware, software, firmware, or a combination of the three. Methods 300 and 550 may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform methods 300 and 550 and to generate output information.

The system may be implemented, at least in part, via one or more computer program products in a machine-readable storage device, for execution by, or to control the operation of, data processing apparatus (e.g., a programmable processor, a computer, or multiple computers). Each such program may be implemented in one or more computer languages, including high level procedural or object-oriented programming languages, assembly code, machine code or any other computer language or combination of languages. The language(s) may be compiled and/or interpreted and may be deployed in any form, including as one or more stand-alone programs or as one or more modules, components, subroutines, or other units suitable for use in a computing environment. The system may also be implemented, at least in part, as firmware.

A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer to perform methods 300 and 550. Methods 300 and 550 may also be implemented as a machine-readable storage medium, configured with a computer program, where upon execution, instructions in the computer program cause the computer to operate in accordance with methods 300 and 550.

Methods 300 and 550 may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

What is claimed:

1. A method for testing an embedded controller in a control system, the method comprising:
   generating one or more test support models for one or more subsystems of the control system, including internal subsystems of the embedded controller and external subsystems that the embedded controller interacts with, wherein at least one test support model of the one or more test support models simulates a subsystem of the one or more subsystems of the control system that includes the embedded controller being tested;
   establishing a communications network between the one or more test support models and a control module of the embedded controller, the control module being internal to the embedded controller;
   generating a clock signal for the control module to initiate processing within the embedded controller and initiate communication between the control module and the one or more test support models;
   executing an event model at corresponding ones of the one or more test support models based on the clock signal, wherein the event model includes settings for the one or more test support models;

generating data at the one or more test support models, the data corresponding to operational parameters of the control system in response to execution of the event model; and generating commands by the control module for the one or more test support models in response to the generated data.

2. The method of claim 1, further comprising preloading message data, event data, and settings for the one or more test support models based on attributes of the corresponding subsystem.

3. The method of claim 2, wherein the settings for the one or more test support models include simulated outputs for the one or more subsystems.

4. The method of claim 2, further comprising generating the message data, event data, and settings for the one or more test support models using previous measurements and data captured by the corresponding subsystems during operation of the respective subsystems.

5. The method of claim 1, further comprising executing one or more frames of the event model based on the clock signal, wherein the one or more frames correspond to different time-periods within the event model.

6. The method of claim 5, further comprising generating the data corresponding to the one or more frames at the one or more test support models based on the clock signal.

7. The method of claim 1, further comprising generating frame advance messages to instruct the one or more test support models to execute the event model up to a particular frame of the event model and generate data for previous frames of the event model.

8. The method of claim 1, wherein the clock signal includes one or more start messages and one or more stop messages to progressively execute one or more frames of the event model.

9. The method of claim 1, further comprising synchronizing messaging between the control module and the one or more test support models based on the clock signal.

10. The method of claim 9, further comprising generating a clock signal having one or more start messages and one or more stop messages to progressively execute the one or more event models.

11. The method of claim 10, wherein each of the one or more event models includes one or more frames corresponding to different time-periods within the one or more event models and generating the data corresponding to the one or more frames at the one or more test support models based on the clock signal.

12. The method of claim 10, further comprising generating frame advance messages to instruct the one or more test support models to execute the one or more event models up to a particular frame of the respective event model and generate data for previous frames of the respective event model.

13. The method of claim 9, further comprising polling the one or more test support models at different time periods and generating data at the one or more test support models at the different time periods.

14. The method of claim 9, wherein the operational parameters include at least one of sensor data, device data, or a communication network status.

15. The method of claim 9, further comprising determining a status of one or more of the subsystems of the control system by comparing the generated data from the one or more test support models to operational thresholds.

16. The method of claim 9, further comprising logging the messages communicated between the control module and the one or more test support models.

17. A method for testing subsystems of an embedded controller, the method comprising:

generating one or more event models for an embedded controller in a control system, each of the one or more event models including settings for one or more test support models, and each of the one or more event models having an execution time value;

providing the one or more event models to the one or more test support models, wherein at least one test support model of the one or more test support models simulates a subsystem of the control system that includes the embedded controller being tested;

executing the one or more event models at corresponding ones of the one or more test support models based on their respective execution time values;

generating data by the one or more test support models, the data corresponding to operational parameters of the subsystems of the control system resulting from execution of the one or more event models;

receiving, at a control module of the embedded controller being tested, the generated data from the one or more test support models, wherein the control module is internal to the embedded controller; and generating, by the control module, messages to each of the one or more test support models responsive to the generated data.

18. An embedded controller testing system comprising:

a means for controlling operation of an embedded controller to be tested;

a means for modeling one or more internal subsystems of the embedded controller and/or external subsystems the embedded controller interacts with, using test support models generated for the one or more subsystems, wherein at least one test support model simulates a subsystem of the one or more subsystems of the embedded controller to be tested, wherein the at least one test support model is external to the embedded controller to be tested;

a means for testing one or more event models for the embedded controller, each of the one or more event models including settings for the one or more subsystems, and each of the one or more event models having an execution time value, wherein the means for testing executes the one or more event models at corresponding ones of the test support models based on their respective execution time values, wherein the means for testing is within the embedded controller to be tested; and a means for communication coupling the means for testing and the means for modeling such that the means for modeling can generate data corresponding to operational parameters of the one or more subsystems resulting from the execution of the one or more event models and provide the generated data to a control module, wherein the control module is internal to the embedded controller.

19. The system of claim 18, wherein components of the embedded controller testing system include at least one of a host unit, one or more mechanism controllers, one or more field programmable gate arrays (FPGAs), one or more memory units, one or more sensors, and one or more devices.

20. The system of claim 18, further comprising an abstraction layer platform hosting the means for modeling on different operating platforms communicatively coupled to the embedded controller.

\* \* \* \* \*